(12) United States Patent
Zalio et al.

(10) Patent No.: US 6,985,514 B2
(45) Date of Patent: Jan. 10, 2006

(54) AUTOMATIC GAIN CONTROL CIRCUIT AND METHOD FOR DIRECT SEQUENCE SPREAD SPECTRUM RECEIVER

(75) Inventors: Filip Zalio, Victoria (AU); Dobrica Vasic, Victoria (AU)

(73) Assignee: NEC Corporation, Tokyo (JP)

( * ) Notice: Subject to any disclaimer, the term of this patent is extended or adjusted under 35 U.S.C. 154(b) by 757 days.

(21) Appl. No.: 09/984,876

(22) Filed: Oct. 31, 2001

(65) Prior Publication Data

US 2002/0075944 A1   Jun. 20, 2002

(30) Foreign Application Priority Data

Nov. 1, 2000   (AU) ..................................... PR1177
Oct. 12, 2001  (AU) ..................................... 79382/01

(51) Int. Cl.
*H04B 1/707*   (2006.01)

(52) U.S. Cl. ..................... 375/147; 375/130; 375/260; 327/164

(58) Field of Classification Search ............... 375/147, 375/345, 99, 103, 118, 206
See application file for complete search history.

(56) References Cited

U.S. PATENT DOCUMENTS

| | | | | |
|---|---|---|---|---|
| 4,633,485 A | * | 12/1986 | Betts et al. | 375/346 |
| 5,635,864 A | * | 6/1997 | Jones | 327/77 |
| 5,764,689 A | | 6/1998 | Walley | |
| 6,477,196 B1 | * | 11/2002 | Swanke et al. | 375/147 |

FOREIGN PATENT DOCUMENTS

WO   WO 00/31867   6/2000

* cited by examiner

*Primary Examiner*—Stephen Chin
*Assistant Examiner*—Jaison Joseph
(74) *Attorney, Agent, or Firm*—McGinn IP Law Group, PLLC

(57) ABSTRACT

An automatic gain control circuit (3) for a direct sequence spread spectrum receiver. A discrimination unit (10) generates a discrimination signal error from received in-phase and quadrature base band signals, whilst multiplication unit (16) multiplies the discrimination signal error by a first loop gain constant during signal acquisition and a second different loop gain constant during signal tracking. A recursive integrator (22) then acquires an integrated AGC value from the multiplied discrimination signal error.

By using two different values of loop gain, the circuit is able to alternate between a "fast mode" during signal acquisition, and a "slow track" mode during signal tracking.

31 Claims, 3 Drawing Sheets

AUTOMATIC GAIN CONTROL CIRCUIT AND METHOD FOR DIRECT SEQUENCE SPREAD SPECTRUM RECEIVER

The present invention relates generally to automatic gain control circuits and methods for use in mobile telephone receivers, and in particular to the use of such circuits and methods in mobile telephony systems using direct sequence spread spectrum techniques for transmitting simultaneous signals over a shared portion of the spectrum.

Mobile phone systems have to utilise a scheme that allows the mobile station to find and analyse radio signals from one or more base stations, often on different radio frequencies. Such process of searching for different base stations is called cell search. During the cell search process, the mobile station identifies all base stations and determines which of them is the most suitable for establishing connection with. Establishing a connection means starting to monitor whether there is an incoming call or allowing the user to make an outgoing call. The cell search has to be performed periodically because when the mobile station is moving, the cell that has been identified as the best may have dropped in quality while radio signal form another cell has become better. Based on the repeating cell search, the mobile station keeps a periodically updated list of all available cells. In case when the signal quality form the currently used cell has dropped below a certain threshold value, the mobile station disconnects from the old cell and reconnects to a new one, that is to say, it performs handover.

In most mobile systems, such W-CDMA, the periodical cell search has to be performed even when there is a call in progress so that the handover can be performed and the call in progress is not dropped in case when the signal from currently used cell decreases in quality while there is another better cell available.

In mobile systems which rely on spread spectrum, such as W-CDMA, the transmission and reception protocol is often designed in such way as to allow for the mobile station to temporarily stop transmitting and receiving and perform a cell search on a different radio channel. The momentary interruption of transmission and reception does not cause any loss of data, because both the mobile station and the base station compensate by temporarily increasing the transmission speed so that the average data transmission speed is maintained. For example if the time used for cell search took 50 percent of all the available time, the base station and the mobile station would transmit twice the normal speed for the remaining 50 percent of time. However, the transmission speed cannot be increased indefinitely because the number of transmittion errors during the interval of increased transmission speed is proportional to logarithm of the ratio between the increased speed and the normal speed. For most practical purposes, a small number of transmission errors are allowed. The mobile phone systems, such as W-CDMA are optimised, so that the time available for the measurement, is very limited because the overall quality of the currently ongoing connection has to be maintained.

When the mobile station stops normal transmission and reception during the cell search interval, it re-tunes to a different radio channel. On this different radio channel the level of the received radio signal is different from the level on the nominal radio channel. Most mobile station receiver designs employ automatic gain control (AGC) system in order to be able to cope with signals of different strength. The AGC system has to determine what is the strength of the received signal and set the gain in the receiver accordingly, i.e. higher gain for lower signal level.

When performing cell search measurements on a different radio frequency channel or in a different cellular system (e.g. GSM) in the case of a dual-mode receiver, a new gain value for the search channel needs to be found within a very short interval, because the time available for the cell search is very limited, typically to a few W-CDMA time slots. In this case, the automatic gain control function needs to be sufficiently rapid to allow most of the search interval to be used for signal measurement and acquisition. However, fast automatic gain control circuit designs of prior art can be unstable and not satisfactory for use during signal tracking when the receiver is connected to an individual W-CDMA cell and slow operation is preferred to optimise the bit error rate.

It would therefore be desirable to provide an automatic gain control circuit and method for use in W-CDMA or other direct sequence spread spectrum receivers that ameliorates or overcomes one or more of the problems of known automatic gain control circuits.

It would also be desirable to provide an automatic gain control circuit and method for direct sequence spread spectrum receivers that is optimised for use during both signal acquisition and tracking.

With this in mind, one aspect of the present invention provides an automatic gain control circuit for a direct sequence spread spectrum receiver, comprising:

discrimination means for generating a discrimination signal error from received in-phase and quadrature base band signals;

multiplying means for multiplying the discrimination signal error by a first loop gain constant during signal acquisition and a second different loop gain constant during signal tracking; and a recursive integrator for acquiring an integrated AGC value from the multiplied discrimination signal error.

An automatic gain control circuit having these features is able to perform in two modes of operation, namely a "fast acquire" mode, and a "slow track" mode. Alternance between these modes is achieved by using different values of loop gain, namely a higher value for use during signal acquisition, and a lower value for use during signal tracking.

Conveniently, the automatic gain control circuit may further comprise means for selectively holding a constant loop gain.

In one embodiment of the invention, the recursive integrator includes:

a first register for storing a first AGC value for use during search channel operation;

a second register for storing a second different AGC value for use during nominal channel operations; and AGC switching means for alternately loading the first and second current AGC values into the recursive integrator respectively upon commencement of search and nominal channel operation.

The maintenance of two separate registers for storing the AGC values used during search and nominal channel operation enables the last known AGC value to be reloaded upon the start of each search interval, thus minimising signal acquisition time. If the signal is not acquired within the first search window, the search is able to continue in the next window, starting with the last known value for that channel.

The AGC switching means may act to save the first current AGC value in the first register at commencement of nominal channel operation.

The AGC switching means may further act to save the second AGC value in the second register at the commencement of search channel operation.

Conveniently, the AGC switching means may act to alternately connect the first and second registers into the recursive integrator respectively during search and nominal channel operation. The automatic gain control circuit may further include:

an acquisition logic circuit for detecting signal and acquisition and for causing selective operation of the multiplying means upon detecting signal acquisition.

Conveniently, the acquisition logic circuit may include:

discrimination means for detecting when the discrimination signal error is less than a programmable hysteresis value for a predetermined duration.

The discrimination means may determine the discrimination signal error from the difference between a preset value and a logarithm of the average amplitude of the received base band signal.

Another aspect of the present invention provides a method of automatically controlling the gain of a direct sequence spread spectrum receiver, comprising:

(a) generating a discrimination signal error from received in-phase and quadrature base band signals;

(b) multiplying the discrimination signal error by a first loop gain constant during signal acquisition, and a second different loop gain constant during signal tracking; and (c) using a recursive integrator to acquire an integrated AGC value from the multiplied discrimination signal error.

Conveniently, the method may further comprise:

(d) selectively holding a constant gain.

In one embodiment, step (c) comprises:

storing in a first register a first AGC value for use during search channel operation;

storing in a second register a second different AGC value for use during nominal channel operations; and alternately loading the first and second current AGC values into the recursive integrator respectively upon commencement of search and nominal channel operation.

The first current AGC value may be saved in the first register at commencement of nominal channel operation. Similarly, the second AGC value may be saved in the second register at the commencement of search channel operation.

The first and second registers may be alternately connected into the recursive integrator respectively during search and nominal channel operation.

Preferably, the method further comprises:

detecting signal acquisition, and selectively multiplying the discrimination signal error by the first loop gain constant upon detecting signal acquisition.

The method may further comprise:

detecting when the discrimination signal error is less than a programmable hysteresis value for a predetermined duration.

The method may further comprise:

determining the discrimination signal error from the difference between a preset value and a logarithm of the average amplitude of the received base band signal.

The following description refers in more detail to the various features of the present invention. To facilitate an understanding of the invention, reference is made in the description to the accompanying drawings where the automatic gain control circuit is illustrated in a preferred embodiment. It is to be understood that the automatic gain control circuit is, however, not limited to the preferred embodiment as illustrated in the drawings.

Figure 1:
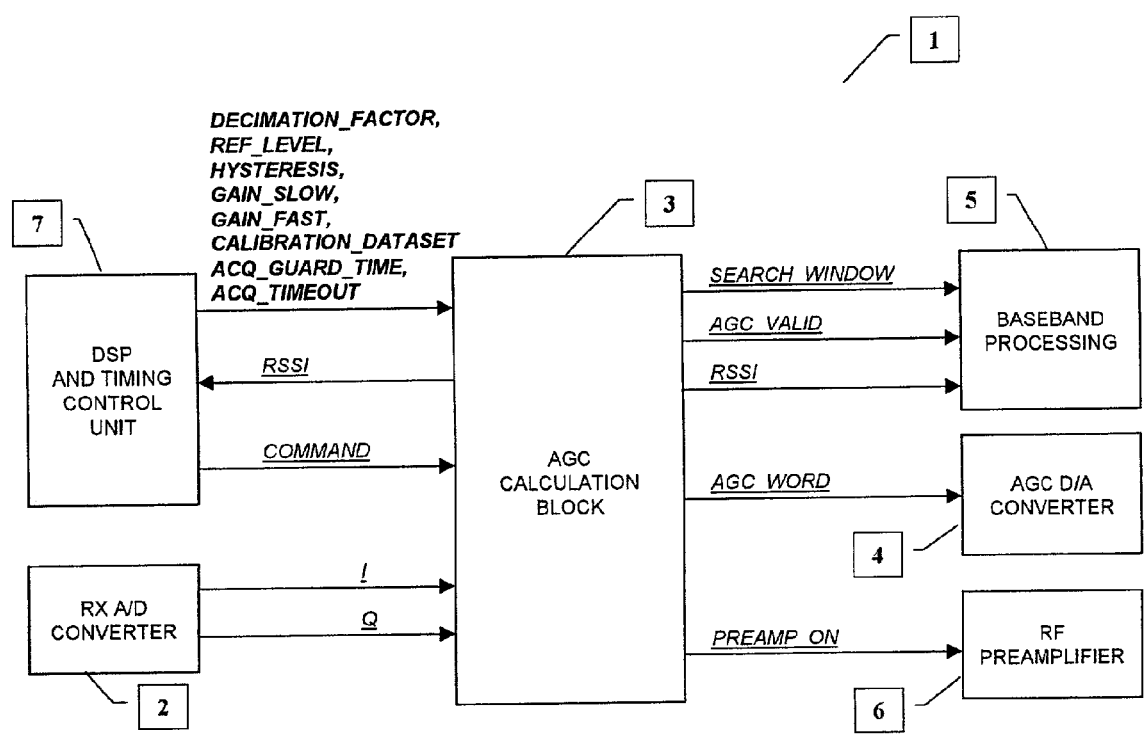
FIG. 1 is a block diagram of a key function blocks of a baseband module of a direct sequence spread spectrum receiver.

Referring now to FIG. 1, there is shown generally a baseband module 1 forming part of a direct sequence spread spectrum receiver. The baseband module 1 includes a receiver analogue-to-digital (A/D) conversion module 2, an automatic gain control (AGC) circuit 3, an AGC digital-to-analogue (D/A) converter 4, a baseband processing unit 5, a radio frequency (RF) preamplifier 6 and a digital signal processing (DSP) and timing control unit 7. The A/D conversion module 2 receives analogue in-phase and quadrature baseband signals from an analogue front end downconverter within the receiver (not shown in this figure), and provide digital equivalents I and Q thereof to the AGC circuit 3.

The AGC circuit 3 determines the receiver gain, and supplies an output signal AGC WORD to the AGC D/A converter module 4 for subsequent use by an RF module of the receiver to control the gain of the analogue in-phase and quadrature received signals. The AGC circuit 3 additionally generates an output signal PREAMP ON for control of the RF preamplifier 6.

The baseband processing unit 5 performs all spread spectrum modulation and de-modulation during signal reception and transmission, both to and from an audio module of the receiver. The AGC circuit 3 generates output signals SEARCH WINDOW, AGC VALID and RSSI for controlling the operation of the baseband processing module 5.

The operation of the AGC calculation block 3 is controlled by the DSP and timing control unit 7, by means of digital control parameters DECIMATION_FACTOR, REF_LEVEL, HYSTERESIS, GAIN_SLOW, GAIN_FAST, CALIBTATION_DATASET, ACQ_GUARD TIME, and ACQ_TIMEOUT, and by the output signal COMMAND. The output signal RSSI is also provided by the AGC circuit 3 to the DSP and timing control unit 7.

Figure 2:
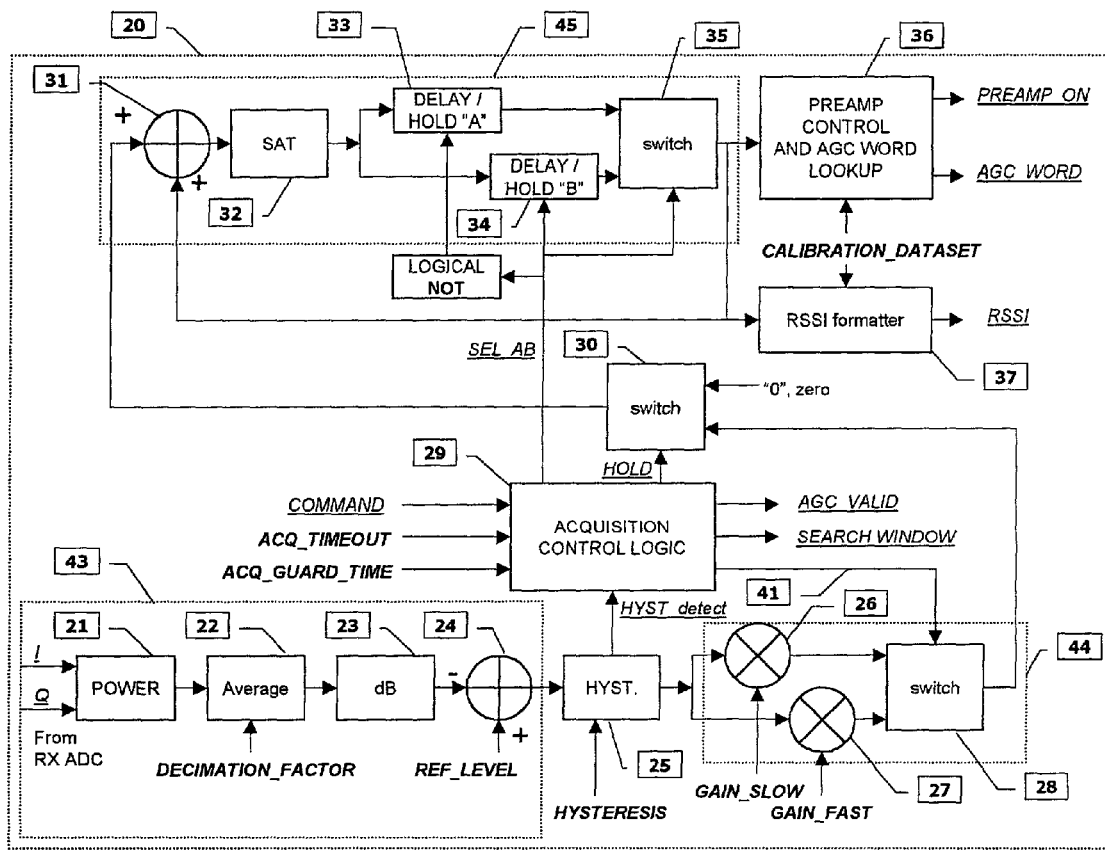
FIG. 2 is a block diagram of an automatic gain control circuit forming part of the base band module of FIG. 1.

FIG. 2 illustrates the basic functional blocks of the AGC circuit 3 shown in FIG. 1. The AGC circuit 3 comprises a discrimination unit 43 for generating a discrimination signal error from the digitised received in-phase and quadrature base band signals I and Q. The discrimination unit 43 includes a power block 21 for calculating the amplitude P of the received digitised in-phase and quadrature signal samples according to the function $P=SQRT(I^2+Q^2)$ An Average block 22 performs an integration of the output from the Power block 21 over a time period defined by the control parameter DECIMATION_FACTOR, according to the function.

$$AVG=SUM\{P[k],P[k-1], \ldots [P/k\text{-DECIMATION\_FACTOR}]\} \div \text{DECIMATION\_FACTOR}$$

This reduces the sampling rate of the received in-phase and quadrature signals to a rate suitable for use by the AGC circuit 3. The dB block 23 calculates the logarithm AVG_dB of the output signal AVG from the Average block 22, according to the function AVG_dB=log(AVG) constant The output from the dB block 23 is subtracted from the value of the control parameter REF_LEVEL by a subtraction block 24, to produce a discrimination signal error ERR. The hysteresis block 25 then compares the ERR signal with a value of the control parameter HYSTERESIS. If the absolute value of ERR signal is less than the value of HYSTERESIS, then the value of a first output HYST_output=0, and the value of a second output signal HYST_detect=true. If the value of the discrimination signal error ERR is not less than the value of the control parameter HYSTERESIS then the value of the first output HYST_output= the value of the signal ERR and the value of the second output HYST_detect=false.

The AGC circuit 3 also includes a multiplication unit 44 for multiplying the discrimination signal error ERR by a first loop gain constant during signal acquisition and a second different loop gain constant during signal tracking. To this end, the multiplication unit 44 includes switching block 28 and multiplication blocks 26 and 27. The multiplying unit 44 is selectively operable to multiply the output $HYST_{13}$ output by either the value of the control parameter GAIN_SLOW or GAIN_FAST, depending upon whether the gain of a received signal is acquired or not.

The multiplied discrimination signal error from the output of the multiplication unit 44 is provided to a recursive integrator 45.

The recursive integrator 45 includes first and second registers 33 and 34, switch 35, saturation block 32 and adder 31. The first register 33 is used to store a second different AGC value for use during nominal channel operation. The second register 24. stores a first AGC value for use when the receiver is on the inter-frequency or inter-system channel used to perform cell search. This channel is frequently referred to as the "search channel". The recursive integrator 45 functions according to:

$$GAIN[k]=GAIN[k-1]+HYST\_Output*GAIN\_SLOW, or$$

$$GAIN[k]=GAIN[k-1]+HYST\_Output*GAIN\_FAST$$

where GAIN is the current AGC value held in either the first or second registers 33 and 34. These registers hold the current logarithmic value of the gain control signal used by the receiver.

The input signal COMMAND provided from the DSP and timing control unit 7 to the AGC calculation block 3 is directly supplied to the acquisition control logic block 29. Depending on the command received from the COMMAND signal and the state of the HYST_detect signal, the acquisition control logic block 29 determines the state of SEL_AB, HOLD and signal 41.

The SEL_AB signal determines whether the AGC value stored in either the first or second register is fed back and recombined with the multiplied discrimination signal error by the adder 31 in order to perform the recursive integration.

The signal 41 controls whether the AGC block 3 is in "slow track" or "fast acquire" mode by choosing either multiplier 26 with GAIN_SLOW constant for "slow track" mode or multiplier 27 with GAIN_FAST constant for "fast acquire" mode.

When the signal HOLD is asserted by the acquisition control logic block 29, the switch 30 causes the first input to the adder 31 to be 0, which in effect preserves the current value of gain held in either the first or second register 33 or 34.

A preamplifier control and AGC word look-up unit 36 is connected to the output of the recursive integrator 45, and converts the output of the recursive integrator 45 into two output signals, namely PREAMP ON and AGC WORD. The PREAMP ON output signal is used to control the radio frequency preamplifier 6. If the gain at the output of the recursive integrator 45 grows by more than a predefined threshold, the PREAMP ON output signal is set to a first state, whereas if the gain falls to another difference threshold the PREAMP ON signal is set to a false state. These two thresholds are set to different values to prevent oscillations which may be caused by the fact that the switching delay of the preamplifier is different to the response time of the gain controlled amplifier, and degradation of the signal caused by frequent switching transients when the signal level is close to the preamplifier threshold. The AGC WORD output signal is produced by conversion of the gain value of the output of the recursive integrator 45, and using a stored replica of the control response of the gain controlled amplifier. All control parameters in this unit 36 are provided by the DSP and timing control unit 7 and are assumed to be calibrated against radio frequency channel frequency and temperature.

The gain at the output of the recursive integrator 45 is also provided to a received signal strength indicator (RSSI) formatter unit 37 which converts the value of the integrator output into an input signal level in dBuV. Once again, the conversion is based upon CALIBRATION_DATASET scaling data provided by the DSP and timing control unit 7, and is calibrated against radio frequency channel frequency and temperature.

The automatic gain control circuit further includes an acquisition logic circuit 29 for
(a) detecting whether signal acquisition has been achieved,
(b) for causing selective operation of the multiplying means 44
(c) for selecting whether to use first or second register 33 or 34 within the recursive integrator 45
(d) for generating the signals AGC_VALID and SEARCH_WINDOW upon detection of signal acquisition or a receipt of a new command.

The acquisition control logic circuit 29 operates as follows: There are five distinct states of operation: "hold", "acquire nominal", "acquire search", "nominal" and "search". There are also five commands that correspond to the above mentioned states of operation, given the same names. A change from one state to another is performed when the dsp and timing control unit 7 issues a new command on the COMMAND signalling bus.

Immediately after receiving "hold" command, the control logic 29 set to true the HOLD signal, and sets to false the AGC_VALID and SEARCH_WINDOW signals. The signals 41 and SEL_AB are kept unchanged.

Immediately after receiving "acquire nominal" command, the control logic 29 sets HOLD signal to false, sets SEL_AB to false, sets signal 41 to true, sets AGC_VALID and SEARCH_WINDOW to false. At the same time, a timeout counter is started. This counter is incremented every AGC clock cycle. If the number of counted clock cycles is larger or equal to ACQ_TIMEOUT, the signal 41 is set to false and AGC_VALID to true. At the same time, if the signal HYST_defect becomes true, second counter is started or when HYST_detect becomes false, the second counter is reset to zero. When the value of the second counter is larger than ACQ_GUARD_TIME, the control logic 29 sets signal 41 to false and AGC_VALID to true and stop the first counter. Typically, the ACQ_TIMEOUT is set to a large value to cover only situations when HYST_detect never becomes true. This only happens during an unexpected system failure, for example faulty AGC D/A converter 4. In normal situations, HYST_detect becomes true after a short time. Setting the signal 41 to false switches the AGC to "slow track" mode, so the moment when the second counter is larger than ACQ_GUARD_TIME can be declared a AGC acquisition.

Immediately after receiving "acquire search" command, the control logic 29 sets HOLD signal to false, sets SEL_AB to true, sets signal 41 to true, sets AGC_VALID and SEARCH_WINDOW to false. After that, the behaviour is the same as after "acquire nominal" command, except that when AGC_VALID is set to true, the SEARCH_WINDOW is also set to true.

Immediately after receiving "nominal" command, the control logic 29 sets HOLD signal to false, sets SEL_AB to false, sets signal 41 to false, sets AGC_VALID to true and SEARCH_WINDOW to false. The two timers are not running in this case.

Immediately after receiving "search" command, the control logic 29 sets HOLD signal to false, sets SEL_AB to true, sets signal 41 to false, sets AGC VALID to true and SEARCH_WINDOW to true. The two timers are not running in this case.

Typically the "hold" command is issued when the mobile station prepares to switch off the radio circuitry in order to preserve power. During this hold mode of operation, the loop gain is selectively held at a constant value. When the radio circuitry is switched on after some time, a "nominal" or "search" command is issued, thus restoring the last know gain value either for nominal or search channel.

The "acquire search" command is typically issued in the first cell search period on a new radio channel. The "search" command is typically used in subsequent search periods utilising the radio channel used in the previous periods and the gain has already been acquired and is stored in the second register "34".

The "acquire nominal" command is typically issued after powering on, when the mobile station is on nominal channel, but the gain has not been acquired yet.

Figure 3:
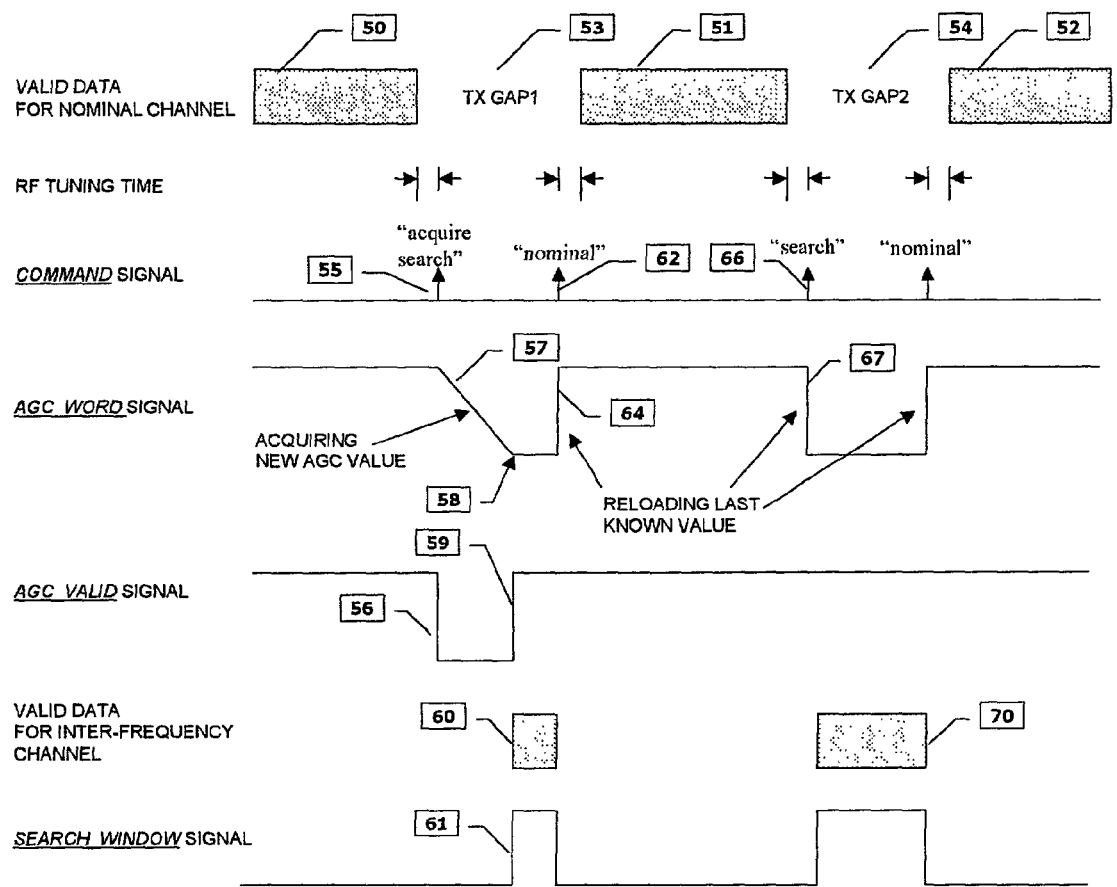
FIG. 3 is a timing diagram showing signal levels at various locations of the automatic gain control circuit of FIG. 2 during operation.

As seen in FIG. 3, valid data for a nominal transmission channel is transmitted in packets 50, 51 and 52, these packets being separated by transmission gaps 53 and 54. Inter-frequency or inter-system cell searching is performed by the receiver in the search channel defined by the transmission gaps 53 and 54. Following the detection of the start of each transmission gap, the DSP and timing control unit 7 sends "acquire search" command 55. The command 55 is detected by the acquisition control logic 29. The detection of the command 55 causes selective operation of the multiplying means 44, so that switches 28 operates and connect the multiplier 27 in series with the HYSTERESIS block 25 and the recursive integrator 45. The AGC calculation block 3 is now in "fast acquire" mode.

The detection of "acquire search" command 55 additionally causes the second register 34 to be connected in series in the recursive integrator 45, enabling the AGC value used during search channel operation to be acquired in the second register 34. The progressively increasing value of the second register 34 is reflected in the sloping edge 57 of the AGC-WORD output signal. When the HYSTERESIS block 25 detects that the discrimination error signal at the output of the adding block 14 is less than the control parameter HYSTERESIS from the DSP and timing control unit 7, as indicated at point 58 in the AGC WORD output signal, the acquisition control logic unit 29, causes the signal 41 to be reset after AGC_GUARD_TIME periods, and the AGC VALID signal to be set to a true value at leading edge 59. At this point, that is to say, upon gain acquisition the multiplying means 44 immediately cause the switch 28 to be selectively operated and the multiplier 26 to now be connected in series between the HYSTERESIS block 25 and the recursive integrator 45. Accordingly, the AGC calculation block 3 is placed in "slow track" mode, and valid data 60 is tracked during the transmission gap 53. Since the command 55 was "acquire search", the signal SEARCH_WINDOW is also set to true value.

At the end of the transmission gap 53, the DSP and timing control unit 7 sends a "nominal" command 62. This command causes the selective operation of the multiplying means 44, so that once again the switch 28 operates to connect the multiply 26 in series between the HYSTERESIS block 25 and the recursive integrator 45. Accordingly, the AGC calculation block 3 is again automatically kept in the "slow track" mode.

Moreover, the command 62 causes the acquisition control logic 29 to reset the SEL_AB signal to false, causing the first register 33 to be connected in series in the recursive integrator 45, thus loading the first current AGC value stored therein for use during nominal channel operation of the receiver. The difference in AGC value stored in the first register 33 and the second register 34 is indicated by the change in value of the AGC WORD signal at leading edge 64.

If the loop gain used during nominal channel operation had been previously acquired, the discrimination signal error would be less than the command word HYSTERSIS, thereby causing the output signal HYST_OUTPUT from the HYSTERESIS block 25 to be zero. The receiver then continues to process the packet 51 of valid data received during the nominal channel operation.

During the next transmission gap 54, the DSP and timing control unit 7 sends a "search" command 66, causing the first register to be connected in series in the recursive integrator 45 and the second AGC value stored in the seconds register 34 to be provided to the AGC D/A converter 4 through the block 36. The reloading of the value stored in the second register 34 is shown at the falling edge 67 of the AGC WORD output signal.

From the foregoing, it can be seen that the AGC calculation block 3 operates in two modes, namely in a "fast acquire" and a "slow track" mode. Alternance between the two modes is affected by the use of two difference values of loop gain as determined by the control parameters GAIN_SLOW and GAIN_FAST. At the start of each search interval, the AGC calculation block 3 is automatically put in to the "fast acquire" mode. The AGC calculation block 3 is switched back to the "slow track" mode when it is determined by the acquisition control logic circuit 29 that the appropriate channel gain has been acquired. Accordingly, the AGC reacquisition time is minimised so that during inter-frequency or inter-system operation, the time during which cell search measurements can be affected can be optimised. Moreover, the last known value of the gain for both nominal and search channel operation are maintained in separate registers, enabling rapid acquisition to be achieved. If the loop gain is not acquired within a programmable number of time periods represented by the control parameter ACQ_TIMEOUT, the AGC calculation block 3 automatically reverts to the "slow track" mode. An output logical signal indicating that the loop gain is valid is only produced if the AGC calculation block 3 is in "slow track" mode.

Finally, it is to be understood that various modifications and additions may be made to the automatic gain control circuit described herein without departing from the spirit or ambit of the invention.

What is claimed is:

1. An automatic gain control (AGC) circuit for a direct sequence spread spectrum receiver, said AGC circuit comprising:

discrimination means for generating a discrimination signal error from received in-phase and quadrature base band signals;

multiplying means for multiplying the discrimination signal error by a first loop gain constant during a signal acquisition, and a second different loop gain constant during a signal tracking; and a recursive integrator for acquiring an integrated AGC value from the multiplied discrimination signal error.

2. An automatic gain control circuit according to claim 1, further comprising:

means for selectively holding a constant gain.

3. An automatic gain control circuit according to claim 1, wherein the recursive integrator comprises:

a first register for storing a first AGC value for use during a search channel operation;

a second register for storing a second different AGC value for use during nominal channel operations; and an AGC switching means for alternately loading the first and second current AGC values into the recursive integrator respectively upon a commencement of search and nominal channel operation.

4. An automatic gain control circuit according to claim 3, wherein the AGC switching means acts to save the first current AGC value in the first register at a commencement of nominal channel operation.

5. An automatic gain control circuit according to claim 4, wherein the AGC switching means further acts to save the second AGC value in the second register at a commencement of search channel operation.

6. An automatic gain control circuit according to claim 3, wherein the AGC switching means acts to alternately connect the first and second registers into the recursive integrator, respectively, during said search and nominal channel operation.

7. An automatic gain control circuit according to claim 1, further comprising:

an acquisition logic circuit for detecting signal and acquisition and for causing selective operation of the multiplying means upon detecting signal acquisition.

8. An automatic gain control circuit according to claim 7, wherein the acquisition logic circuit comprises:

a discrimination means for detecting when the discrimination signal error is less than a programmable hysteresis value for a predetermined duration.

9. An automatic gain control circuit according to claim 8, wherein the discrimination means determines the discrimination signal error from a difference between a preset value and a logarithm of an average amplitude of a received base band signal.

10. A method of automatically controlling the gain of a direct sequence spread spectrum receiver, said method comprising:

generating a discrimination signal error from received in-phase and quadrature base band signals;

multiplying the discrimination signal error by a first loop gain constant during a signal acquisition and a second different loop gain constant during a signal tracking; and using a recursive integrator to acquire an integrated AGC value from the multiplied discrimination signal error.

11. A method according to claim 10, further comprising: selectively holding a constant gain.

12. A method according to claim 10, wherein said using a recursive integrator comprises:

storing in a first register a first AGC value for use during a search channel operation;

storing in a second register a second different AGC value for use during nominal channel operations; and alternately loading the first and second current AGC values into the recursive integrator respectively upon a commencement of search and nominal channel operation.

13. A method according to claim 12, wherein the first current AGC value is saved in the first register at a commencement of nominal channel operation.

14. A method according to claim 13, wherein the second AGC value is saved in the second register at a commencement of search channel operation.

15. A method according to claim 12, wherein the first and second registers are alternately connected into the recursive integrator respectively during search and nominal channel operation.

16. A method according to claim 10, further comprising:

detecting a signal acquisition; and selectively multiplying the discrimination signal error by the first loop gain constant upon detecting signal acquisition.

17. A method according to claim 16, further comprising:

detecting when the discrimination signal error is less than a programmable hysteresis value for a predetermined duration.

18. A method according to claim 17, further comprising:

determining the discrimination signal error from a difference between a preset value and a logarithm of an average amplitude of a received base band signal.

19. An automatic gain control circuit according to claim 2, wherein the recursive integrator comprises:

a first register that stores a first AGC value for use during a search channel operation;

a second register that stores a second different AGC value for use during nominal channel operations; and AGC switching means for alternately loading the first and second current AGC values into the recursive integrator respectively upon a commencement of search and nominal channel operation.

20. An automatic gain control circuit according to claim 4, wherein the AGC switching means acts to alternately connect the first and second registers into the recursive integrator respectively during a search and nominal channel operation.

21. An automatic gain control circuit according to claim 5, wherein the AGC switching means acts to alternately connect the first and second registers into the recursive integrator respectively during a search and nominal channel operation.

22. A method according to claim 11, wherein said using a recursive integrator comprises:

storing in a first register a first AGC value for use during a search channel operation;

storing in a second register a second different AGC value for use during a nominal channel operations; and alternately loading the first and second current AGC values into the recursive integrator respectively upon a commencement of search and nominal channel operation.

23. A method according to claim 13, wherein the first and second registers are alternately connected into the recursive integrator respectively during search and nominal channel operation.

24. A method according to claim 14, wherein the first and second registers are alternately connected into the recursive integrator respectively during search and nominal channel operation.

25. A method according to claim 11, further comprising:
detecting signal acquisition; and
selectively multiplying the discrimination signal error by the first loop gain constant upon detecting signal acquisition.

26. A method according to claim 12, further comprising:
detecting a signal acquisition, and
selectively multiplying the discrimination signal error by the first loop gain constant upon detecting signal acquisition.

27. A method according to claim 13, further comprising:
detecting a signal acquisition, and
selectively multiplying the discrimination signal error by the first loop gain constant upon detecting signal acquisition.

28. A method according to claim 14, further comprising:
detecting a signal acquisition, and
selectively multiplying the discrimination signal error by the first loop gain constant upon detecting signal acquisition.

29. A method according to claim 15, further comprising:
detecting a signal acquisition, and
selectively multiplying the discrimination signal error by the first loop gain constant upon detecting signal acquisition.

30. A direct sequence spread spectrum receiver as comprising the AGC circuit of claim 1.

31. A direct sequence spread spectrum receiver, comprising:
an automatic gain control (AGC) circuit comprising:
  a discriminator that generates a discrimination signal error from received in-phase and quadrature base band signals;
  a multiplier that multiplies the discrimination signal error by a first loop gain constant during a signal acquisition, and a second different loop gain constant during a signal tracking; and
  a recursive integrator that acquires an integrated AGC value from the multiplied discrimination signal error.

* * * * *